United States Patent [19]

Usami et al.

[11] Patent Number: 5,306,924
[45] Date of Patent: Apr. 26, 1994

[54] SEMICONDUCTOR DEVICE WITH STRAINED-LAYER SUPERLATTICE

[75] Inventors: Masashi Usami, Tanashi; Yuichi Matsushima, Tokorozawa, both of Japan

[73] Assignee: Kokusai Denshin Denwa Kabushiki Kaisha, Tokyo, Japan

[21] Appl. No.: 27,192

[22] Filed: Mar. 5, 1993

[30] Foreign Application Priority Data

Mar. 12, 1992 [JP] Japan ............................ 4-087465

[51] Int. Cl.$^5$ .................. H01L 27/12; H01L 29/161; H01L 33/00
[52] U.S. Cl. ............................ 257/18; 257/15; 257/17; 257/185; 257/190; 257/191; 372/43
[58] Field of Search ............... 257/15, 17, 18, 19, 257/185, 190, 191, 201; 372/43-45

[56] References Cited

U.S. PATENT DOCUMENTS

| | | | |
|---|---|---|---|
| 5,048,036 | 9/1991 | Scifres et al. | 257/190 |
| 5,060,030 | 10/1991 | Hoke | 257/18 |
| 5,061,970 | 10/1991 | Goronkin | 257/15 |
| 5,075,743 | 12/1991 | Behfar-Rad | 372/43 |
| 5,090,790 | 2/1992 | Zucker | 257/18 |
| 5,181,086 | 1/1993 | Yoshida | 257/18 |

FOREIGN PATENT DOCUMENTS

| | | | |
|---|---|---|---|
| 63-284869 | 11/1988 | Japan | 257/190 |
| 02130988 | 5/1990 | Japan | 372/43 |
| 0432220 | 2/1992 | Japan | 257/190 |
| 04298050 | 10/1992 | Japan | 257/190 |

OTHER PUBLICATIONS

Fritz et al, "Critical Layer Thickness in $In_{0.02}Ga_{0.8}As$/GaAs Single Strained Quantum Well Structure," Appl. Phys. Lett., vol. 51, No. 13, Sep. 28, 1987. pp. 1004-1006.

Primary Examiner—Rolf Hille
Assistant Examiner—Mahshid Saadat
Attorney, Agent, or Firm—Emmanuel J. Lobato; Robert E. Burns

[57] ABSTRACT

A semiconductor device with a strained-layer superlattice is disclosed, in which a first semiconductor and a second semiconductor of a lattice constant smaller than that of the first semiconductor are stacked on a clad layer of a lattice constant substantially intermediate between those of the first and second semiconductors to form the strained-layer superlattice. The lattice constant of the strained-layer superlattice in the direction of its plane in the free space is nearly equal to the lattice constant of the clad layer. A third semiconductor of a lattice constant substantially equal to that of the clad layer is laminated between the first and second semiconductors stacked one on the other.

2 Claims, 8 Drawing Sheets

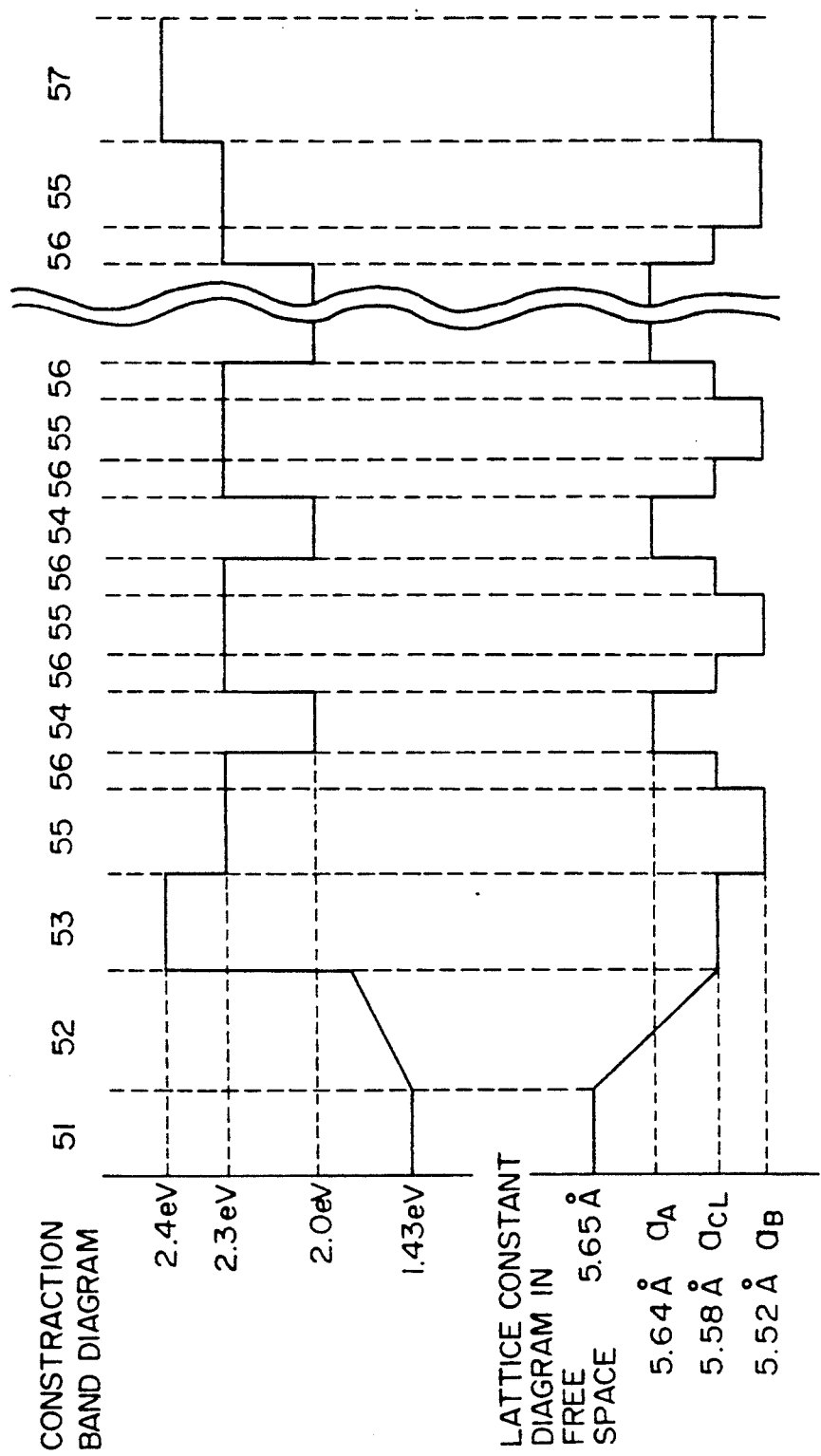

$a_B < a_{SL} < a_A$

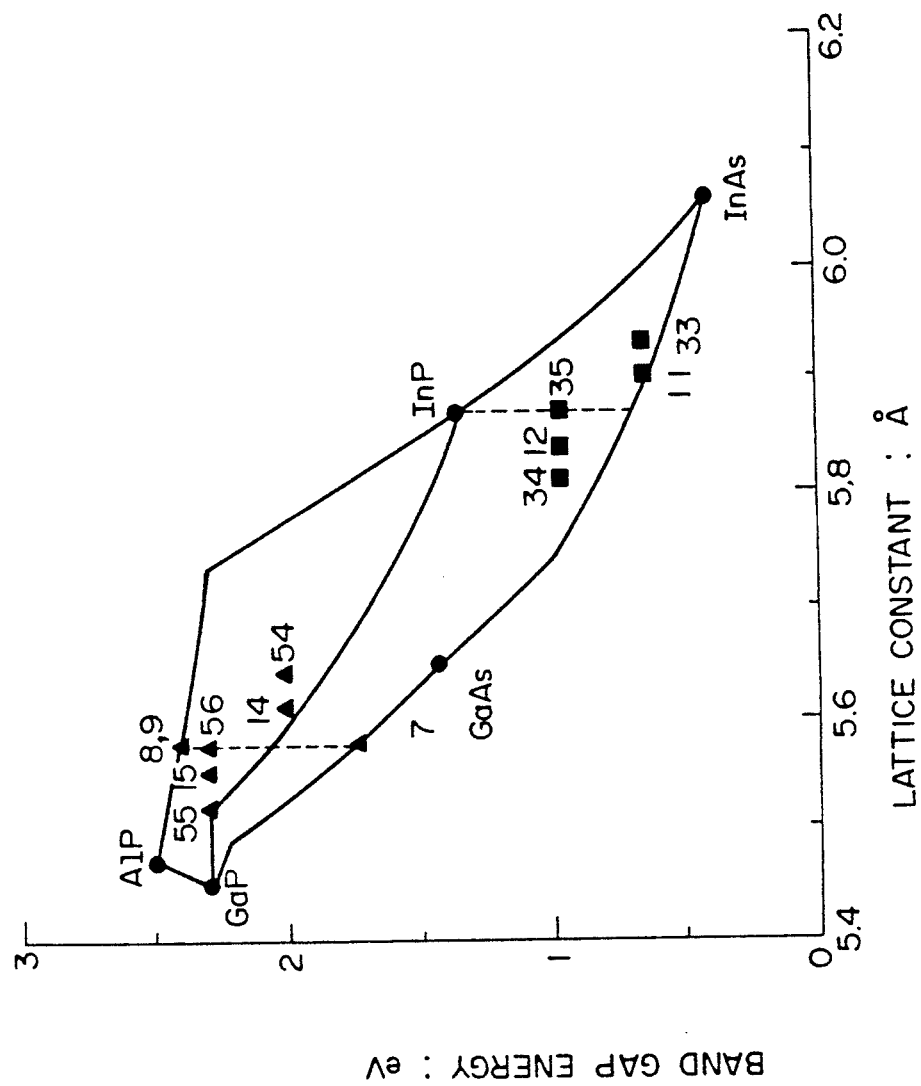

SEMICONDUCTOR DEVICE WITH STRAINED-LAYER SUPERLATTICE

BACKGROUND OF THE INVENTION

The present invention relates to semiconductor devices such as a semiconductor optical device and a semiconductor electron device which utilize a strained-layer superlattice.

With the recent progress of thin film growth technology, it is now possible to grow alternately layers of semiconductor materials of different lattice constants without causing crystal defects when the layers are sufficiently thin. This structure is commonly referred to as a strained-layer superlattice or strained quantum well. The structure of the semiconductor device with the strained-layer superlattice in its active layer substantially raises the degree of freedom of selecting semiconductor materials, thereby permitting the growth, on ordinary clad layers, of materials of band gap energies, optical characteristics, electrical characteristics and the like which are unobtainable with a lattice matching system.

Conventional semiconductor devices with the strained-layer superlattice have a structure wherein well layers and barrier layers stacked alternately with each other, and at least one layers of the well layers and the barrier layers are formed of a semiconductor of a lattice constant greater than, substantially equal to, or smaller than that of the clad layer.

In case of fabricating the strained-layer superlattice by the epitaxial growth of sufficiently thin layers of materials having different lattice constants, the material of a large lattice constant is subjected to a compressive stress in the direction of the plane of the strained-layer superlattice and the material of a small lattice constant is subjected to a tensile stress in the direction of the plane of the strained-layer superlattice. As a result, the lattice constant of the strained-layer superlattice in the direction of its plane assumes a certain value included in a range between the both lattice constants. Now, let this value be represented as the lattice constant, in the plane direction, $a_{SL}$ in an imaginary state in which the strained-layer superlattice is floating in the free space, i.e. floating in space off the clad layer. FIGS. 7A and 7B show variations in the lattice constant by the stacking of layers. FIG. 7A shows a semiconductor A of a lattice constant $a_A$ and a semiconductor B of a lattice constant $a_B$. FIG. 7B shows stacked semiconductors A and B of a common lattice constant $a_{SL}$ of the imaginary state in the free space and a clad layer C of the lattice constant $a_{CL}$.

As depicted in FIG. 7B, in the case of stacking semiconductors of different lattice constants in the free space, the interface of the layers is subjected to a strain, but since the stresses applied to the strain-layer superlattice in its entirety are in equilibrium, it is possible to grow layers of the both materials repeatedly without causing dislocations and other defects. In practice, however, since the strained-layer superlattice is grown, not in the free space, but on a clad layer which is far thicker than each layers of the superlattice, the lattice constant of the strained-layer superlattice in its plane direction is constrained to become the same as the lattice constant of the clad layer, not the lattice constant $a_{SL}$ in the free space. In consequence, the entire strained-layer superlattice is stressed by the clad layer. Hence, the conventional semiconductor device having the strained-layer superlattice is defective such that as the number of layers forming the strained-layer superlattice increases, the overall stress imposed thereon increases to reach a critical film thickness at last, causing defects. Thus, it is difficult to grow a strained-layer superlattice having many layers. Materials of widely different lattice constants cannot be used for semiconductors A and B, that is, the degree of freedom for selecting the materials for these two kinds of layers is low. Moreover, the use of particular pairs of materials, such as AlAs/InAs and GaAsP/InGaAs, may sometimes encounter difficulty in direct crystal growth.

SUMMARY OF THE INVENTION

It is an object of the present invention to provide a semiconductor device of the type having a strained-layer superlattice in which the overall stress imposed on the superlattice is reduced.

To attain the above object of the present invention, there is proposed a semiconductor device with a strained-layer superlattice comprising:
a first semiconductor layer; a second semiconductor layer having a lattice constant smaller than that of the first semiconductor layer; a third semiconductor layer having a lattice constant substantially intermediate between those of the first and second semiconductor layers; and a clad layer having a lattice constant substantially equal to that of the third semiconductor layer; the first and second semiconductor layers being laminated alternately each other to form a strained-layer superlattice on the clad layer; the third semiconductor layer being laminated between the first and second semiconductor layers.

The second semiconductor layer has a lattice constant 0.5% or more smaller than that of the first semiconductor layer.

The present invention features the construction of the strained-layer superlattice by forming well layers and barrier layers of materials having lattice constants greater and smaller than that of the clad layer.

Moreover, a material whose lattice constant is close to that of the clad layers is laminated as an intermediate layer between the well layer and the barrier layer. What is intended to mean by the "lattice constant close to that of the clad layers" is a lattice constant which differs by 0.5% of or less than the lattice constant of the clad layers. The provision of such an intermediate layer enlarges the free scope of the selection of materials which make the lattice constant $a_{SL}$ of the strained-layer superlattice in the direction of its plane in the free space substantially equal to the lattice constant $a_{CL}$ of the clad layers, besides the degree of freedom for structure such as the number of layers rises. With such a structure, the stress applied to the strained-layer superlattice by the clad layer can be reduced to substantially zero regardless of the number of layers of the strained-layer superlattice. Hence, it is possible to achieve the growth of a strained-layer superlattice with many layers.

BRIEF DESCRIPTION OF THE DRAWINGS

The present invention will be described in detailed below with reference to accompanying drawings, in which

FIG. 1A is an enlarged scale view of a part of the embodiment in FIG. 1;

FIG. 5 is a conduction band diagram of the layer structure near an active layer in the embodiment of FIG. 4 and its lattice constant diagram in the free space;

FIG. 8 is a characteristic diagram showing a relationship between the band gap energies and the lattice constants of materials of the strained-layer superlattice.

DETAILED DESCRIPTION

Embodiment 1

Figure 1:
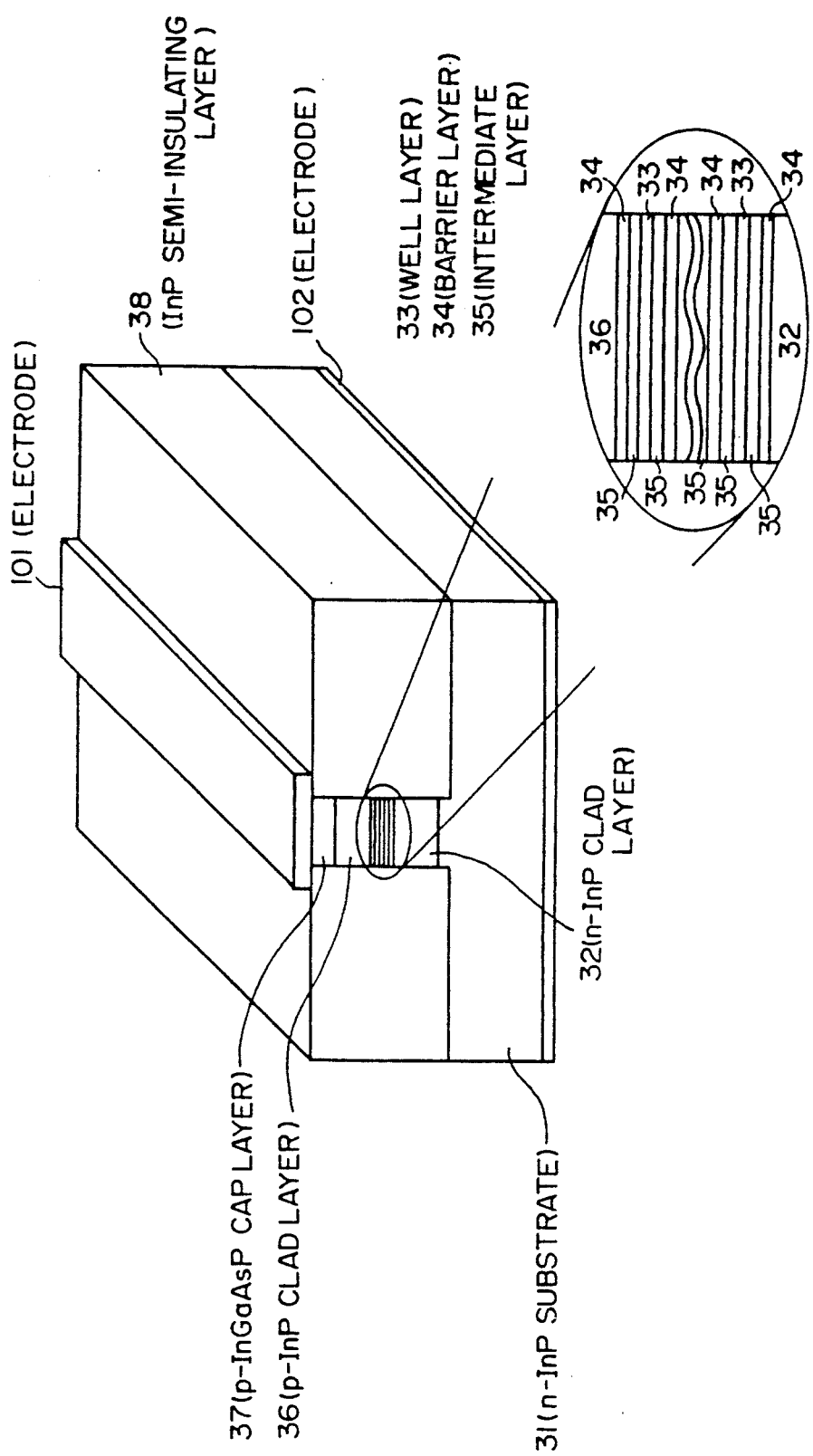
FIG. 1 is a perspective view illustrating, a first embodiment of the present invention.

FIGS. 1 and 1A illustrate a first embodiment of the present invention, which is a light emitting device using an InGaAsP/InP strained-layer superlattice wherein the intermediate layer is provided between the well layer and the barrier layer. In FIG. 1, as shown in enlarged scale in FIG. 1A, there are stacked an n-type InP substrate 31 an n-type InP clad layer 32, InGaAsP well layers 33, InGaAsP barrier layers 34, InGaAsP intermediate layers 35, a p-type InP clad layer 36 and a p-type InGaAsP cap layer 37 for electrode contact, so that a buried stripe structure is formed by a semi-insulating InP layer 38 for lateral mode stabilization and for current contraction. The electrodes 102 and 101 are provided in contact with the substrate 31 and the cap layer 37, respectively.

The well layers 33 have a lattice constant of 5.93 Å and a band gap energy of 0.66 eV. The barrier layers 34 have a lattice constant of 5.81 Å and a band gap energy of 0.95 eV. The intermediate layers 35 have a lattice constant of 5.87 Å and a band gap energy of 0.95 eV. The clad layers 32 and 36 have a lattice constant of 5.87 Å and a band gap energy of 1.35 eV. The substrate 31 has the same lattice constant and band gap energy as those of the clad layers 32 and 36. Thus, the barrier layers 34 have a lattice constant about 2.0% smaller than that of the well layers 33, and the clad layers 32 and 36 have a lattice constant substantially intermediate between those of the barrier layers 34 and the well layers 33. The barrier layers 34 and the well layers 33 are stacked in fifteen alternate layers. The uppermost and lowermost layers are the barrier layers and an intermediate layer 35 is laminated between each well layer and each barrier layer. A total of twenty-nine stacked layers form the strained-layer superlattice or strained quantum well. The lattice constant $a_{SL}$ of the strained-layer superlattice in the free space matches with the lattice constant of the clad layers 32 and 36 as the result of the selection of materials for the well layers 33, the barrier layers 34 and the intermediate layers 35. In this embodiment, an in-plane compressive stress is applied to the well layers 33, by which more stable TE oscillation is obtained.

Figure 2:
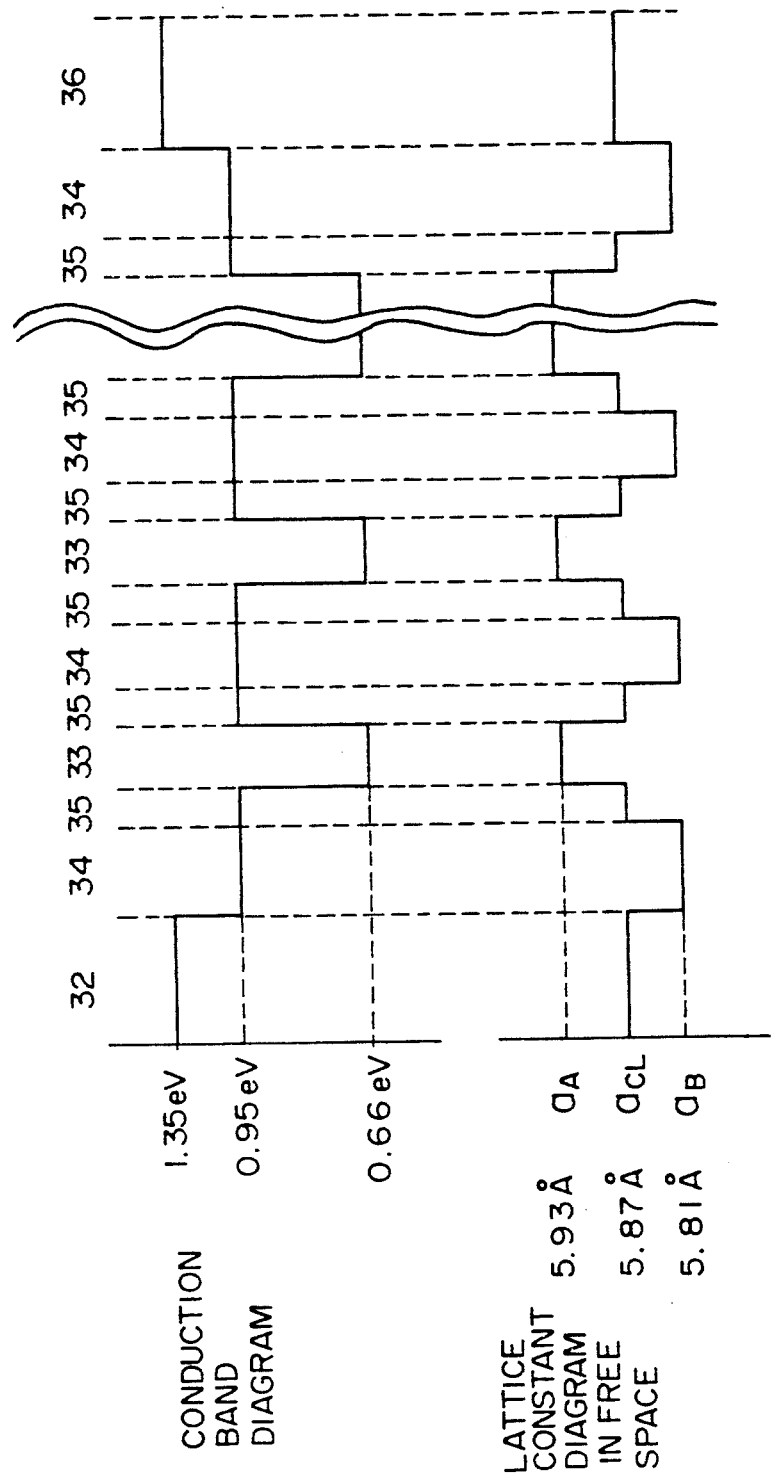
FIG. 2 is a conduction band diagram of the layer structure near an active layer in the embodiment of FIG. 1 and its lattice constant diagram in the free space.

FIG. 2 shows a conduction band diagram of the layer structure near the active layer and its lattice constant diagram in free space.

FIG. 8 shows a relationship between the band gap energies and the lattice constants of materials of the strained-layer superlattice. The materials exemplified in FIG. 8 include materials which are used in Embodiments 2 and 3 described later on.

Although in this embodiment the well layers 33 are formed of a material which has a lattice constant larger than that of the material for the barrier layers 34, the well layers 33 may also be formed of a material which has a lattice constant smaller than that of the material for the barrier layers 34. In this instance, it is necessary, of course, that the lattice constant of the clad layers 32 and 35 be substantially intermediate between the lattice constants of the well layers 33 and the barrier layers 34. In a case where the well layers 33 are formed of a material which has a lattice constant greater than that of the material for the barrier layers 34, an in-plane compressive stress is imposed on the well layers 34, by which more stable TE oscillation is obtained. When the well layers 33 are formed of a material whose lattice constant is smaller than that of the material for the barrier layers 34, an in-plane tensile stress is applied to the well layers 33, by which more stable TM oscillation is obtained.

Embodiment 2

Figure 3:
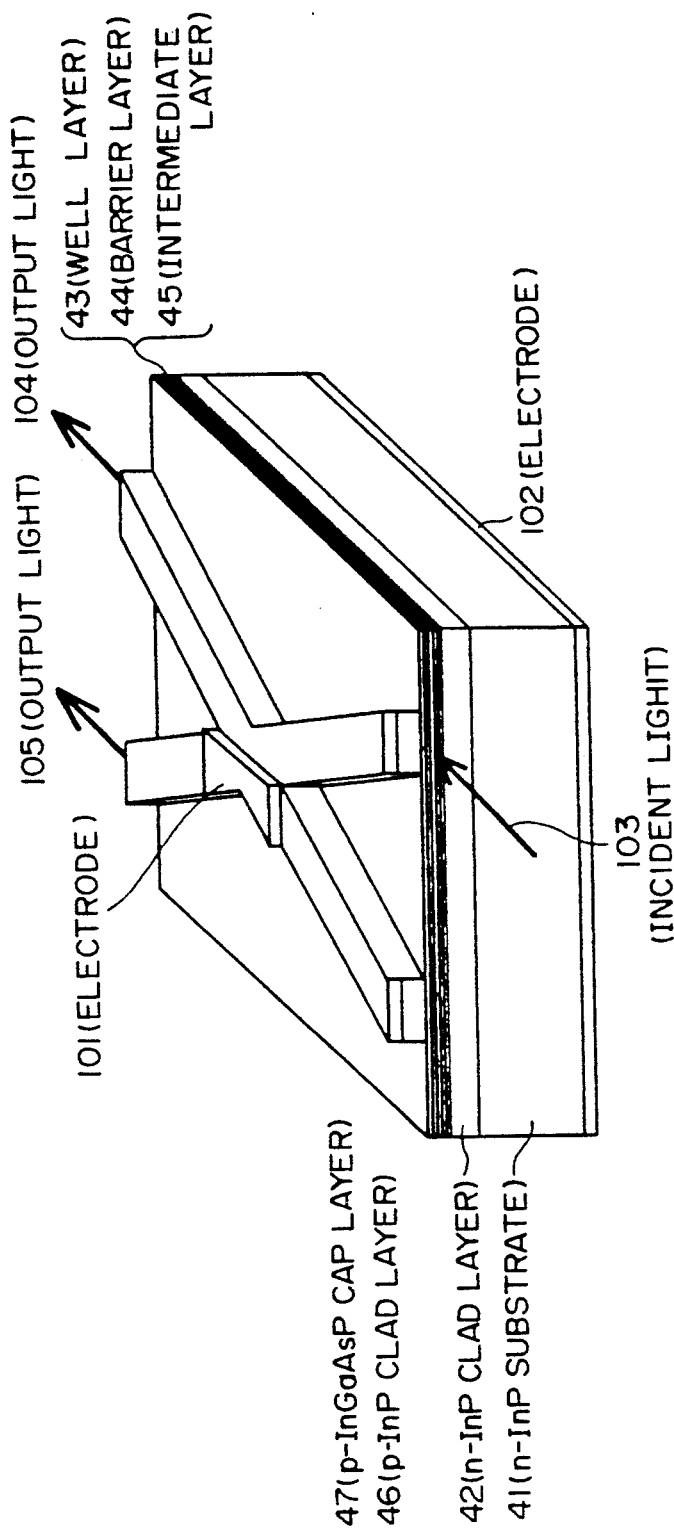
FIG. 3 is a perspective view illustrating a second embodiment of the present invention.

FIG. 3 illustrates a second embodiment of the invention, which is an optical switching device employing the same strained-layer superlattice structure as that in Embodiment 1. This device is identical in construction with an ordinary X-waveguide type optical switch except that the waveguide layer is formed by the strained-layer superlattice in accordance with the present invention. On an n-type IriP substrate 41 there are stacked an n-type clad layer 42 and InGaAsP well layers 43, InGaAsP barrier layers 44 and InGaAsP intermediate layers 45 to form the waveguide layer. On the top of the thus stacked structure a p-type InP clad layer 46 and a p-type InGaAsP cap layer 47 for electrode contact are provided as an X-shaped ridge, to provide a ridge waveguide. The electrodes 102 and 101 are provided in contact with the substrate 41 and the cap layer 47, respectively. The well layers 43 have a lattice constant of 5.93 Å and a band gap energy of 0.66 eV. The barrier layers 44 have a lattice constant of 5.81 Å and a band gap energy of 0.95 eV. The intermediate layers 45 have a lattice constant of 5.87 Å and a band gap energy of 0.95 eV. The clad layers 42 and 46 have a lattice constant of 5.87 A and a band gap energy of 1.35 eV. The substrate 41 has the same lattice constant and band gap energy as those of the clad layers 42 and 46. Hence, the barrier layers 43 have a lattice constant about 2.0% smaller than that of the well layers and the clad layers 42 and 46 have a lattice constant substantially intermediate between those of the barrier layers 44 and the well layers 43. The barrier layers 44 and the well layers 43 are stacked in fifty-one alternate layers, the uppermost and lowermost ones of which are barrier layers 44, and the intermediate layer 45 is laminated between each well layer and each barrier layer. A total of one hundred and one stacked layers form the strained-layer superlattice or strained quantum well. Each triad of layers has a thickness of 50 Å.

A description will be given of the operation of the optical switch according to this embodiment. Upon injection of carriers into the waveguide layers from the electrode 101 making contact with an area one half the ridge intersecting portion at one side thereof, the refractive index of the waveguide layer decreases due to a plasma effect and incident light 103 guided to the ridge intersection is totally reflected there owing to the resulting refractive index difference to produce output light 104. On the other hand, when no carriers are injected, the input light 103 is guided intact and provided as output light 105. Hence, this optical switching element is an optical switch which controls the path of light by ON-OFF control of a current.

While in this embodiment the well layers 43 are formed of a material which has a lattice constant greater than that of the material for barrier layers 44, the well layers 43 may also be formed of a material whose lattice constant is smaller than that of the material for the barrier layers 44. In this instance, it is necessary, of course, that the lattice constant of the clad layers 42 and 46 be substantially intermediate between the lattice constants of the well layers 43 and the barrier layers 44.

Embodiment 3

Figures 4, 4A:
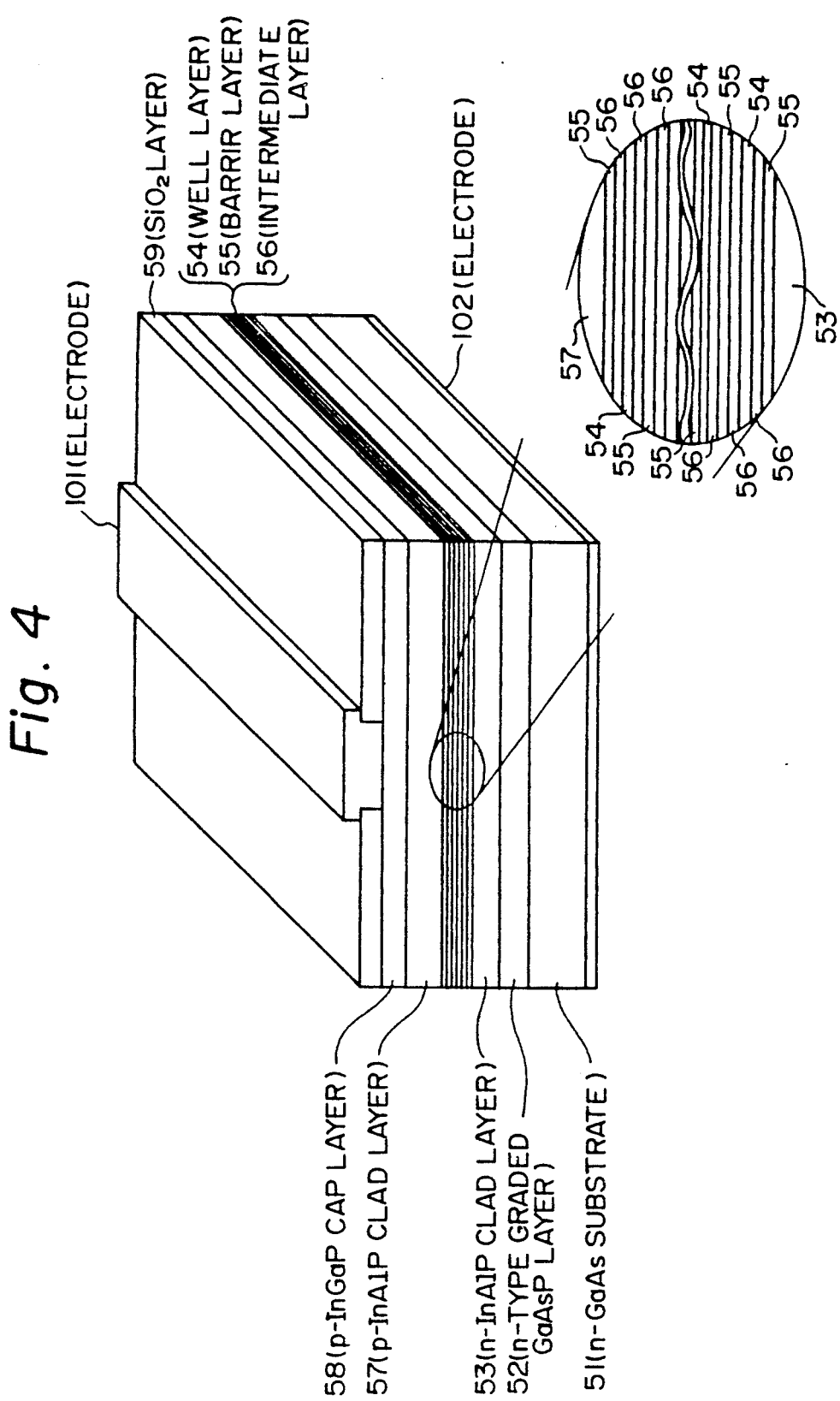
FIG. 4 is a perspective view illustrating, a third embodiment of the present invention.
FIG. 4A is an arranged scale view of a part of the embodiment in FIG. 4.

FIGS. 4 and 4A illustrate a third embodiment of the present invention, which is a light emitting device employing a strained-layer superlattice formed of materials different from those used in Embodiments 1 and 2. In FIG. 4, as shown in an enlarged scale in FIG. 4A, there are stacked, on an n-type GaAs substrate 51, an n-type graded GaAsP layer 52 whose lattice constant gradually varies in a direction perpendicular thereto, an n-type InAlP clad layer 53, InGaAlP well layers 54, InGaAlP barrier layers 55, InGaAlP intermediate layers 56, a p-type InAlP clad layer 57 and a p-type InGaP cap layer 58 for electrode contact. The thus stacked structure is formed as a stripe structure by an SiO$_2$ film 106 for current contraction. The electrodes 102 and 101 are provided in contact with the substrate 51 and the cap layer 58, respectively.

The well layers 54 have a lattice constant of 5.64 Å and a band gap energy of 2.0 eV. The barrier layers 55 have a lattice constant of 5.52 Å and a band gap energy of 2.3 eV. The intermediate layers 56 have a lattice constant of 5.58 Å and a band gap energy of 2.3 eV. The substrate 51 has a lattice constant of 5.65 Å and a band gap energy of 1.43 eV. The graded layer 52 is a layer whose lattice constant gradually varies from 5.65 Å to 5.58 Å. The clad layers 53 and 57 have a lattice constant of 5.58 Å and a band gap energy of 2.4 eV. Hence, the barrier layers 55 have a lattice constant about 2.3% smaller than that of the well layers 54 and the clad layers 53 and 57 have a lattice constant substantially intermediate between those of the barrier layers 55 and the well layers 54. The barrier layers 55 and the well layers 54 each having a thickness of 70 Å are stacked in fifteen alternate layers, the uppermost and lowermost ones of which are barrier layers, and the respective barrier layers and well layers are separated from each other by the intermediate layers 56 each laminated between them. A total of nineteen stacked layers form the strained-layer superlattice or strained quantum well. The lattice constant a$_{SL}$ of this strained-layer superlattice in the free space matches with the lattice constant a$_{CL}$ of the clad layers 53 and 57 as the result of the selection of materials for the well layers 54, the barrier layers 55 and the intermediate layer 56.

FIG. 5 shows a conduction band diagram of the layer structure near the active layer and a lattice constant diagram in the free space.

The graded layer 52 is grown between the substrate 51 and the clad layer 53 and is characterized in that its lattice constant gradually varies in such a manner as to be nearly equal to the lattice constants of the substrate 51 and the clad layer 53 in the planes adjoining them, respectively. The provision of the graded layer 52 allows the substrate 51 and the clad layers 53 and 57 to have different lattice constants and enlarges the free scope of the selection of materials therefor, permitting the growth of materials of large band gap energies and hence the generation of light of shorter wavelengths.

Although in this embodiment the well layers 54 are formed of a material which has a lattice constant larger than that of the material for the barrier layers 55, the well layers 54 may also be formed of a material whose lattice constant is smaller than that of the material for the barrier layers 55. In this instance, it is necessary, of course, that the clad layers 53 and 57 have a lattice constant substantially intermediate between those of the well layer 54 and the barrier layers 55. In a case where the well layers 54 are formed of a material whose lattice constant is larger than those of the material for the barrier layers 55, an in-plane compressive stress is imposed on the well layers 54, by which more stable TE oscillation is provided. When the well layers 54 are formed of a material whose lattice constant is smaller than that of the material for the barrier layers 55, an in-plane tensile stress is applied to the well layers 54, by which more stable TM oscillation is provided.

While the foregoing three embodiments have been described to employ semiconductor substrates as of InP and GaAs, the invention could easily be applied to substrates of other semiconductor materials. The present invention has been described as being applied to semiconductor lasers and optical switches, but the invention is easily applicable to an light emitting diode, a photodetector, a high-speed transistor and similar electronic devices. In the embodiments the well layers, the barrier layers and the intermediate layers are described to have. the same thickness, their thicknesses may be changed in accordance with particular uses of the device.

In the present invention, the reason for which the lattice constant of the clad layers is selected to be approximately median between the lattice constants of the well layers and the barrier layers is to obtain a condition $(|a_{SL}-a_{CL}|/a_{CL})<0.5\%$, where a$_{SL}$ is the lattice constant of the strained-layer superlattice in the direction of its plane in the free space and a$_{CL}$ is the lattice constant of the strain superlattice in the direction of its plane in the free space and a$_{CL}$ is the lattice constant of the clad layers.

Furthermore, according to the present invention, a difference between the lattice constants of the well layers and the barrier layers is selected to be 0.5% or more with a view to obtain the effect of the strained-layer superlattice. With the existing semiconductor technology, it is possible to form a strained-layer superlattice in which a difference in lattice constant between the well layers and the barrier layers is a maximum of 7.2% or so.

Figure 6:
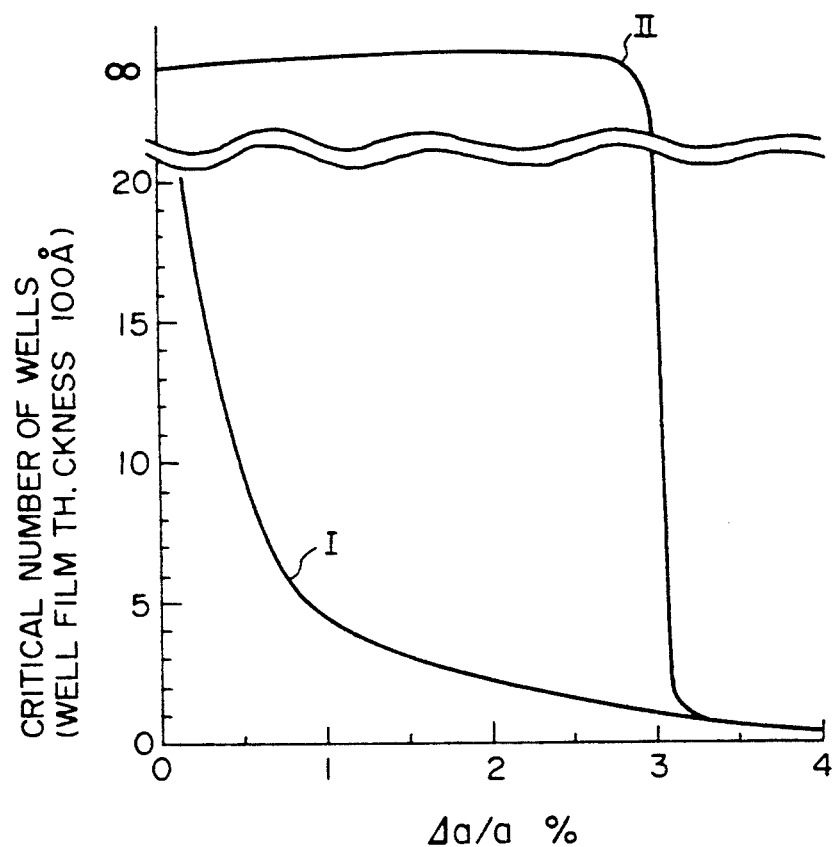
FIG. 6 is a characteristic diagram showing each relationship between a difference in lattice constant and the critical number of wells in each of the prior art and the present invention.
Figure 7B:
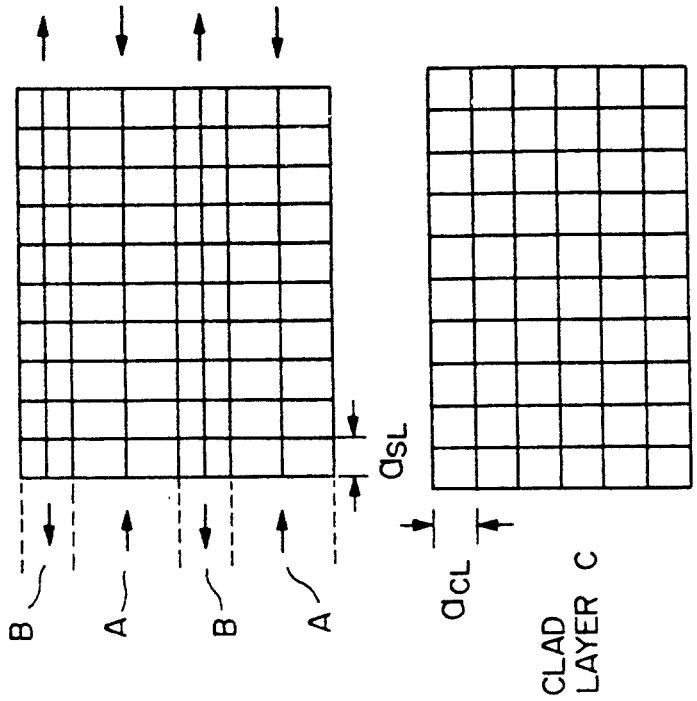
FIG. 7A and 7B are diagrams for explaining variations in the lattice constants of the strained-layer superlattice in the direction of its plane before and after the stacking of its layers.
Figure 7A:
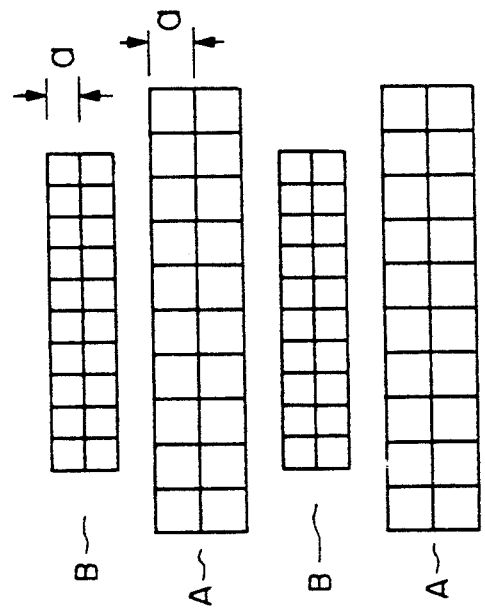

In the prior art strained-layer superlattice, defects occurs when the product of the overall thickness and numbers of well layers reaches a critical film thickness, that is, the maximum film thickness to which they can be grown without defects. On the other hand, in the strained-layer superlattice according to the present invention, an unlimited number of wells can be grown without defects theoretically. FIG. 6 shows a relationship between the lattice constant difference $\Delta a/a$ and the critical number of wells which means the critical film thickness in each of the strained-layer superlattices according to the prior art (I) and the present invention (II). As will be seen from FIG. 6, according to the present invention, an infinite critical number of wells can be provided until the lattice constant difference reaches about a value of 3%. Though not shown in FIG. 6, if the width of each well layer is reduced, the well layers can be grown even in the case of the larger lattice constant difference $\Delta a/a$. Conversely, if the width of each well layer is increased, the well layers cannot be grown in excess of the difference $\Delta a/a$.

Moreover, as will be appreciated from FIG. 6, when the difference $\Delta a/a$ is less than 0.5%, ten or more well layers can be grown without defects even in the conventional strained-layer superlattice and the difference $\Delta a/a$ readily varies within the range of 0.2 to 0.3%. Hence, the difference in lattice constant which makes the effect of the present invention remarkable is in the region of $|\Delta a/a\Delta>0.5\%$.

By fabricating the strained-layer superlattice in such a manner that the lattice constant $a_{SL}$ of the strained-layer superlattice in the direction of its plane in the free space is substantially equal to the lattice constant $a_{CL}$ of the clad layers, the overall stress imposed on the strained-layer superlattice can be reduced to zero or a very small value regardless of the number of layers of the strained-layer superlattice. This allows easy growth of a strained-layer superlattice having many layers.

Furthermore, since the two kinds of materials of the strained-layer superlattice are separated from each other by an intermediate layer of a third materials whose lattice constant is close to that of the clad layer, even in case of using materials which are difficult of direct crystal growth, they can be easily grown with the intermediate layer held therebetween.

By applying such a strained-layer suprelattice having a large number of layers to an light emitting device, a photodetector and similar electronic devices, their ability can be markedly improved.

What we claim is:

1. A semiconductor device with a strained-layer superlattice comprising:
   a first semiconductor layer;
   a second semiconductor layer having a lattice constant smaller than that of the first semiconductor layer;
   a third semiconductor layer having a lattice constant substantially intermediate between those of the first and second semiconductor layers;
   a clad layer having a lattice constant substantially equal to that of the third semiconductor layer;
   the first and second semiconductor layers being laminated alternately each other to form a strained-layer superlattice on the clad layer; and
   the third semiconductor layer being laminated between the first and second semiconductor layers.

2. A semiconductor device with a strained-layer superlattice according to claim 1, wherein the second semiconductor layer has a lattice constant 0.5% or more smaller than that of the first semiconductor layer.

* * * * *